United States Patent
Azadet et al.

(10) Patent No.: US 7,085,794 B2
(45) Date of Patent: Aug. 1, 2006

(54) LOW POWER VECTOR SUMMATION METHOD AND APPARATUS

(75) Inventors: Kameran Azadet, Morganville, NJ (US); Meng-Lin Yu, Morganville, NJ (US); Zhan Yu, Sunnyvale, CA (US)

(73) Assignee: Agere Systems Inc., Allentown, PA (US)

( * ) Notice: Subject to any disclaimer, the term of this patent is extended or adjusted under 35 U.S.C. 154(b) by 580 days.

(21) Appl. No.: 10/122,997

(22) Filed: Apr. 12, 2002

(65) Prior Publication Data

US 2003/0195906 A1 Oct. 16, 2003

(51) Int. Cl.
*G06F 7/38* (2006.01)
*G06F 17/10* (2006.01)

(52) U.S. Cl. ........................ 708/550; 708/300
(58) Field of Classification Search ........ 708/750–751, 708/300, 319, 550
See application file for complete search history.

(56) References Cited

U.S. PATENT DOCUMENTS

| 5,696,710 A | * | 12/1997 | Hague et al. ............... 708/551 |
| 6,148,319 A | * | 11/2000 | Ozaki ......................... 708/550 |
| 6,874,007 B1 | * | 3/2005 | Denk et al. ................. 708/550 |

\* cited by examiner

*Primary Examiner*—Tan V. Mai

(57) ABSTRACT

An arrangement is provided for using 2's complement arithmetic without the high switching activity of the prior art. In particular, the invention operates to exploit the sign-extension property of a 2's complement number. A reduced representation for 2's complement numbers is provided to avoid sign-extension and the switching of sign-extension bits. The maximum magnitude of a 2's complement number is detected and its reduced representation is dynamically generated to represent the signal. A constant error introduced by the reduced representation is also dynamically compensated.

15 Claims, 8 Drawing Sheets

$$
\begin{array}{l}
\phantom{+\ }1 \ldots 1 \quad 1 \quad \leftarrow \text{compensation vector } C_{N-1,m-1} \\[4pt]
+\quad \overline{X}_{m-1}\ X_{m-2} \ldots \ldots X_0 \leftarrow \text{m-bit reduced representation} \\ \hline
\phantom{+\ }X_{m-1} \ldots X_{m-1}\ X_{m-1}\ X_{m-2} \ldots \ldots X_0 \\[4pt]
\phantom{+\ }N-1 \ldots\ m\quad m-1\ m-2 \ldots \ldots\ 0 \quad \text{bit position}
\end{array}
$$

US 7,085,794 B2

LOW POWER VECTOR SUMMATION METHOD AND APPARATUS

FIELD OF INVENTION

The invention relates to digital signal processing and more particularly to vector summation at low power levels.

BACKGROUND OF THE INVENTION

The implementation of arithmetic circuits is very important in digital signal processing and communications applications. Moreover, as circuit complexity continues to increase, power requirements of the equipment becomes more and more important, particularly in equipment developed for portable operation (and thus battery powered).

As is well-known, a summing of a vector of numbers is a common requirement in DSP systems—e.g., digital filters. In such DSP systems, an accumulation path with a long word-length is needed to prevent overflow. However, in many cases, when inputs to the accumulation path are of a small magnitude, only a short word length is needed to represent the magnitude of the input value.

Numerous design techniques are known for simplifying the complexity of arithmetic operations, and for otherwise reducing the power dissipation in digital arithmetic circuits. In particular, the 2's complement number signal representation has been widely used in arithmetic circuit design due to the ease of implementation of arithmetic functions. However, it is also well known that when a 2's complement number switches between a positive and negative value, large signal transmission activity occurs in the most-significant-bits (MSBs) of the data path. As will be apparent, such a high level of switching activity runs counter to an objective for low power operation. As is also well known, for small-valued input signals, a number of the MSBs in a 2's complement representation do not provide useful information.

While low power techniques that exploit the use of other types of signal representation are known in the art—e.g., sign-magnitude and signed-digit, the easy to implement properties of 2's complement arithmetic circuits are lost in those techniques.

SUMMARY OF THE INVENTION

The method of the invention provides an arrangement for using 2's complement arithmetic without the high switching activity of the prior art. In particular, the invention operates to exploit the sign-extension property of a 2's complement number. A reduced representation for 2's complement numbers is provided to avoid sign-extension and the switching of sign-extension bits. The maximum magnitude of a 2's complement number is detected and its reduced representation is dynamically generated to represent the signal. A constant error introduced by the reduced representation is also dynamically compensated.

With the method of the invention, the easy-to-implement properties of 2's complement numbers are preserved, but the high switching activity in their most-significant bits is avoided. The method of the invention has been implemented in an adaptive filter and shown to reduce power dissipation by approximately 40 percent in a typical application.

DETAILED DESCRIPTION

The invention is described hereafter in the context of an application involving Finite Impulse Response (FIR) filters, but it should be understood that the novel features of the invention may also be applied for other digital filter applications, as well as to digital signal processing/arithmetic applications generally.

As a predicate to discussion of the invention, a well-known property of 2's complement numbers—sign extension—is first reviewed. That property is used to derive the reduced representation of a 2's complement number, which is in turn used by the methodology of the invention.

An N-bit 2's complement number X is represented by N bits of the form: $\{x_{N-1}, x_{N-2}, \ldots x_1, x_0\}$. The most significant bit (MSB) $x_{N-1}$ is the sign bit, where $X_{N-1}=0$ indicates that X is a positive number and $x_{N-1}=1$ indicates that X is negative. If X has a magnitude less than $2^{m-1}$, bit $x_{m-1}$ is the sign bit. In that case, bits $x_{N-1}, \ldots, x_{m-1}$ (which are required to maintain the N-bit length) simply repeat $x_{m-1}$ and form a string of 0s or 1s which are called sign extension. One can rewrite the foregoing 2's complement number X as $\{x_{m-1}, \ldots, x_{m-1}, x_{m-2}, \ldots, x_0\}$—ie., all of the bits in the range of bit positions $x_{N-1}, \ldots, x_{m-1}$ are simply shown as repeated copies (sign extension) of sign bit $x_{m-1}$. Since a sign-extension is composed of repeated sign-bits, the information contained in the sign-extension bits is redundant.

Figure 1:
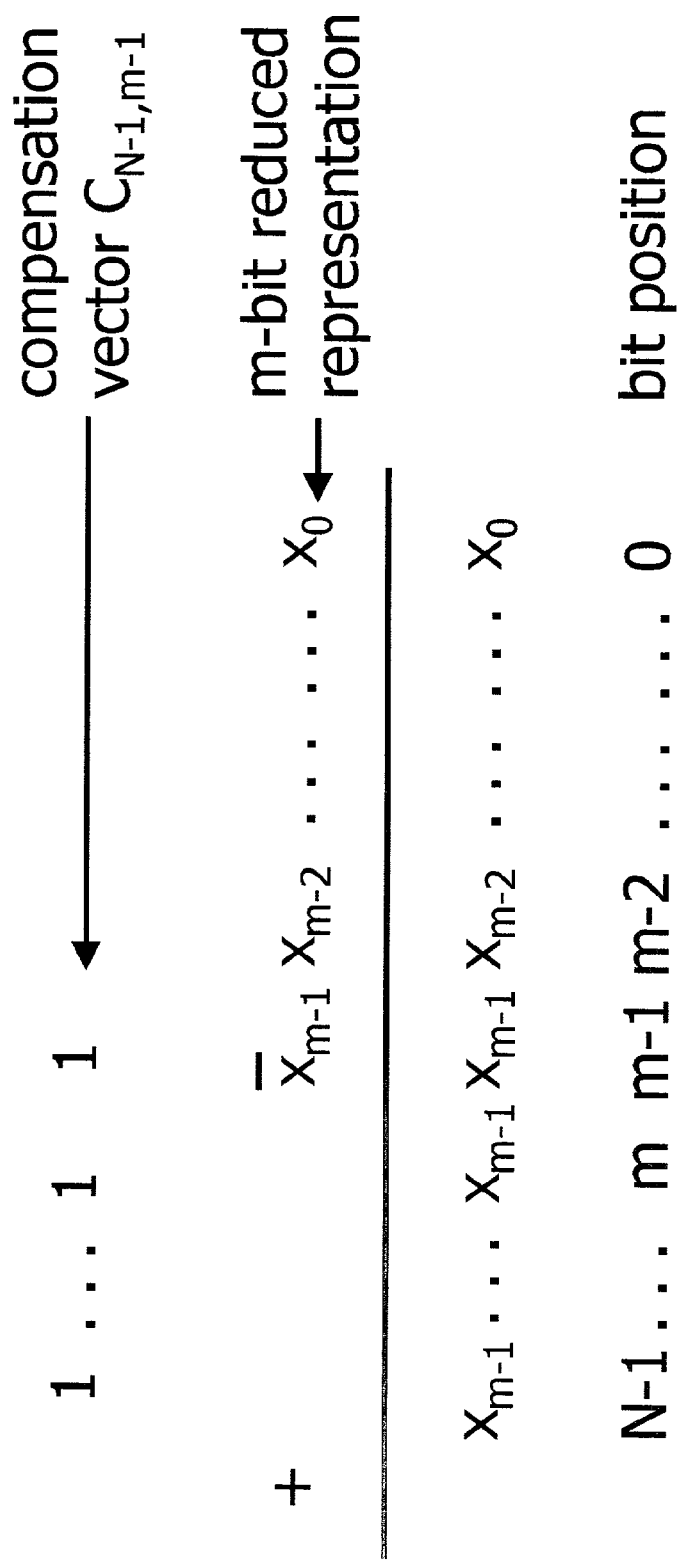
FIG. 1 provides an illustration of a reduced representation for a 2's complement number.

It is known that a 2's complement number with sign-extension can be represented by the sum of an m-bit vector $\{0,0,\ldots,\overline{x}_{m-1},x_{m-2},\ldots,x_0\}$ (with the sign bit flipped—i.e., "1" to "0" or vice versa, where $\overline{x}_{m-1}$ indicates the complement of the sign bit) and a constant vector which has a string of 1s from bit N−1 to bit m−1 (i.e., the sign bit) at the MSB side. This property is illustrated in FIG. 1. The constant vector is called a compensation vector and is denoted as $C_{N-1,m-1}$. The binary vector $\{0,0,\ldots,\overline{x}_{m-1},x_{m-2},\ldots,x_0\}$ is an m-bit reduced representation of the 2's complement number. Such representation is often more efficient than the N-bit representation with sign-extension. This property is used in building 2's complement addition circuits to reduce the number of adder cells used at the MSB side. When one needs to add up such N-bit 2's complement numbers, it is only necessary to build the circuitry to add the m-bit reduced representation vectors and the sum of the compensation vectors, which sum could be precomputed as a single constant vector.

In contrast, for an N-bit representation of a 2's complement number, when the number switches between a positive value and negative value, all of its sign-extension bits must be switched. The switching of each such sign extension bit consumes a finite amount of power, so that such a switching operation is very undesirable in low power circuit design. However, with the reduced representation form for a 2's complement number, the MSBs are not switching at all, since they are always 0s. This property is exploited by the inventors in the low-power filter of the invention.

The invention will hereafter be described in terms of an illustrative application, specifically, the implementation of an adaptive FIR filter with five-level symbol inputs using 2's complement reduced representation arithmetic. It should, however, be understood that the method of the invention is generally applicable to various DSP arrangements and applies, as well, to other kinds of input signals.

For a 5-level signal, each symbol takes one of the values in the set: $\{-2, -1, 0, +1, +2\}$. The symbols could be represented by 3-wire signals {zero, shift, comp} according to Table 1.

TABLE I

| Symbol | 3-Wire Coding | | |
|---|---|---|---|
| | zero | shift | comp |
| −2 | 0 | 1 | 1 |
| −1 | 0 | 0 | 1 |
| 0 | 1 | 0 | 0 |
| +1 | 0 | 0 | 0 |
| +2 | 0 | 1 | 0 |

Figure 2:
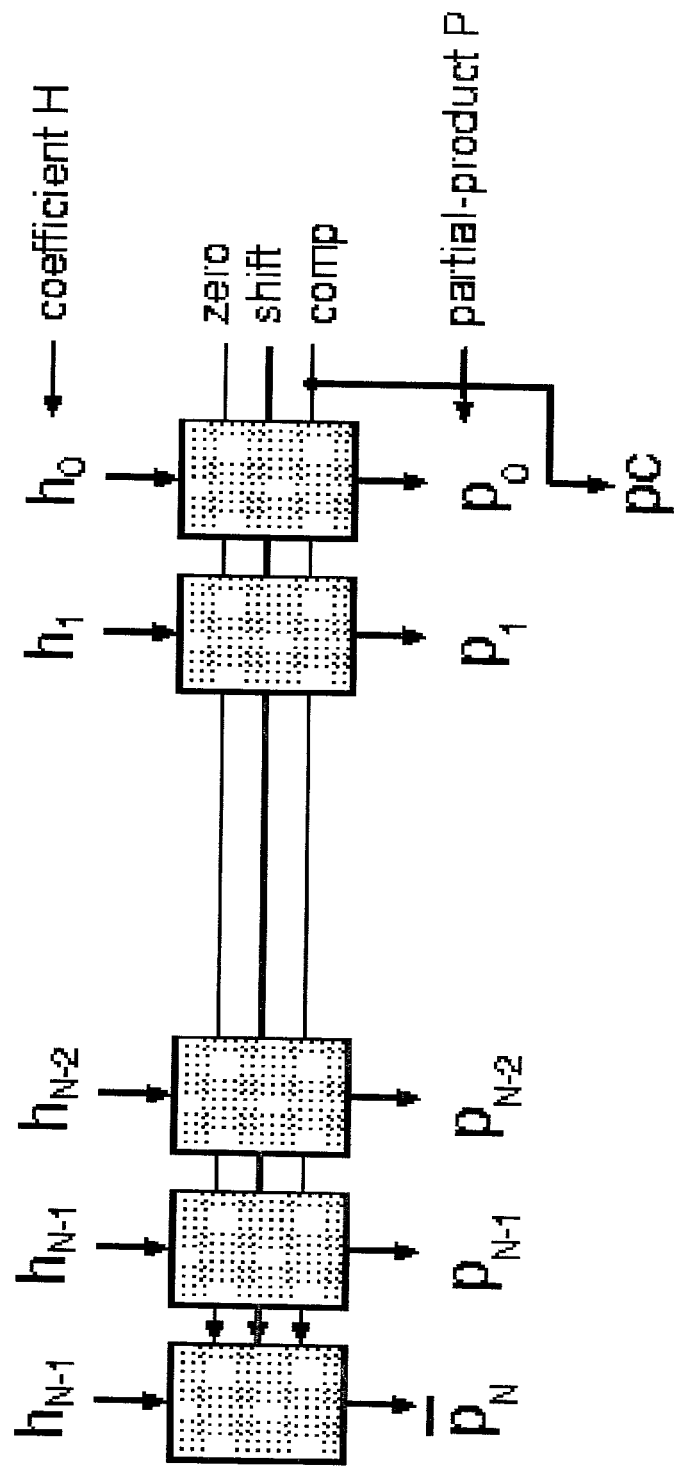
FIG. 2 provides a schematic depiction of a partial product generator.

The number of taps in an adaptive filter could be large, ranging from tens to over a hundred, depending on the channel characteristic. Each tap computes the product of the data symbol and a filter coefficient. The results are added in the accumulation path. Because the data symbols take values in $\{-2, -1, 0, +1, +2\}$, such multiplication is very simple. The product of a data symbol and a given coefficient is called a partial-product. Assuming the coefficients are N-bit 2's complement numbers, those partial products are represented by N+1 binary bits. An exemplary partial-product generation circuit for the 5-level data signal considered here is illustrated in FIG. 2, that generation circuit being implemented as a parallel structure that does not require carry-propagation.

Figure 3:
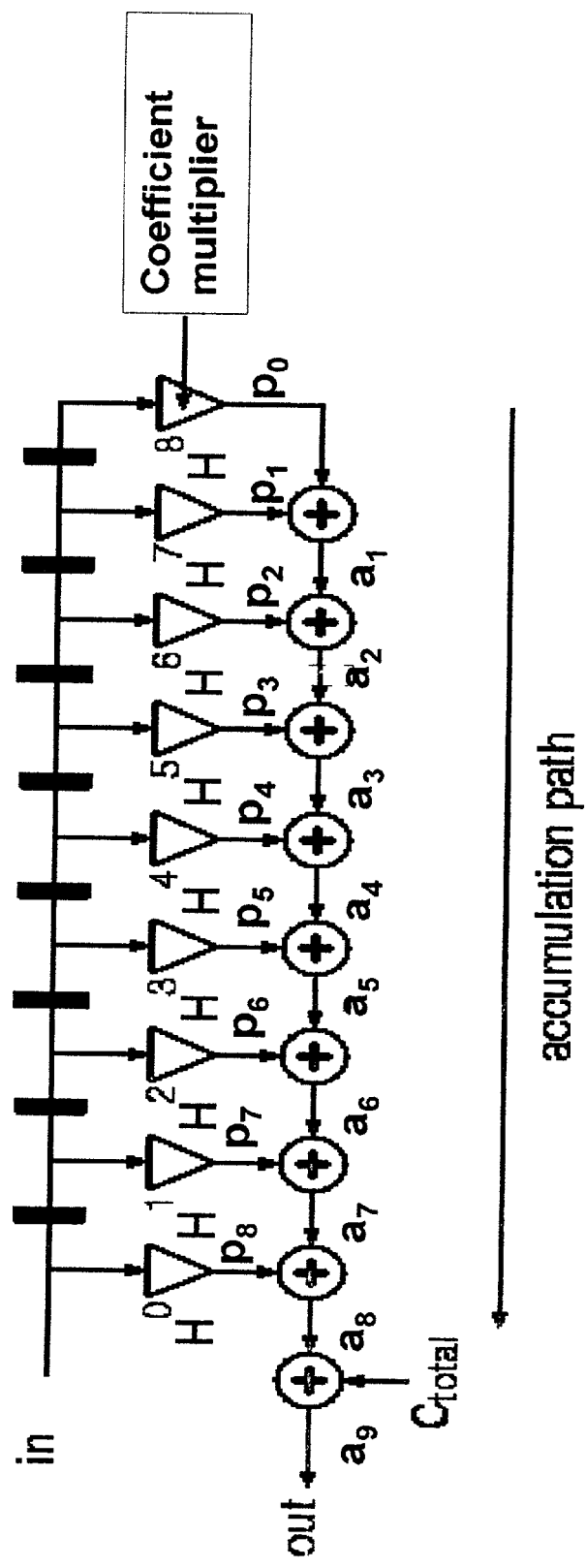
FIG. 3 provides a schematic depiction of an FIR filter.

A first level implementation of 2's complement reduced representation would be carried out as follows. It is known that the accumulation path for such a filter must be arranged with a long word-length in order to prevent overflow. As such, the word length for the accumulation path is at least several bits longer than the N+1 bit length of the partial products. Accordingly, the N+1 bits of a partial product can be constituted as the reduced representation vector. Note that the MSB ($\bar{P}_N$) of the partial product is a negated sign-bit. Assuming that the output of the FIR filter—i.e., the accumulation path—requires B bits, a compensation vector $C_{B-1,N}$ is then added for each tap, thereby reducing the number of adder cells required for the partial product generation. The sum of all compensation vectors ($C_{B-1,N} \times $number_of_taps, denoted as $C_{total}$) should be added at the end of the filter accumulation path, as shown in FIG. 3.

Figure 4:
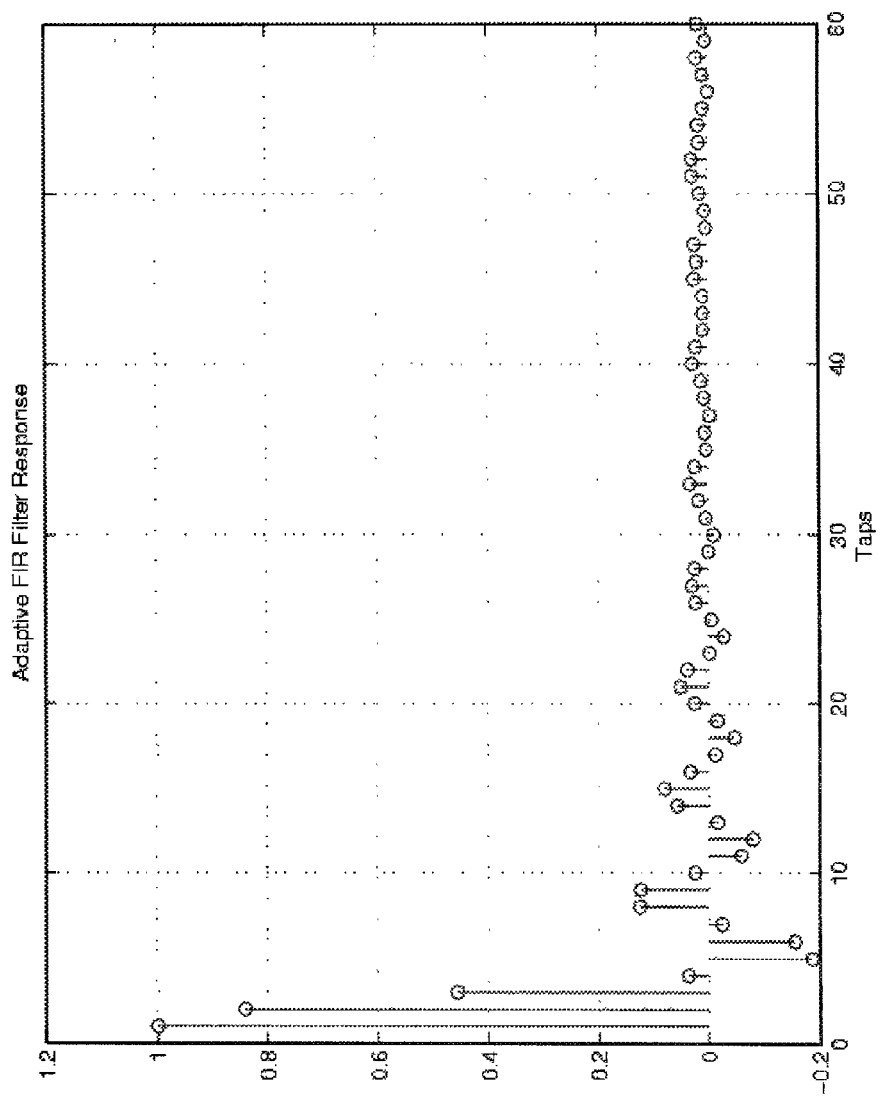
FIG. 4 shows a typical response of an adaptive filter after convergence.

The foregoing implementation of 2's compliment reduced representation is predicated on the assumption that all coefficients or partial products are the same length (N bits), and correspondingly, the savings in adder cells is the difference in bit length between the bit-length of the accumulation path and the partial-product bit length. Thus, in an adaptive filter design using that form of reduced representation, a full word-length multiplier must be built to accommodate the possibly large coefficient/partial-product dynamic range during the adaptation phase—i.e., for an adaptive filter with N bit coefficients and 5-level symbol inputs, an N+1 bit partial-product generator must be built. However, after the coefficients of an adaptive filter have converged, some coefficients take values with small magnitude. FIG. 4 shows a typical response of an adaptive filter after convergence. Note that many taps have small coefficients in comparison to the main tap.

For those small-valued coefficients, the corresponding partial-products have small magnitudes and long sign-extensions if represented by 2's complement numbers. The invention operates to generate partial-products using reduced representation based on the magnitude of the coefficient, in order to avoid the sign-extension switching of a 2's complement representation. Assume, for purposes of illustrating the method of the invention, that the maximum magnitude of a coefficient H is detected as being less than $2^{m-2}$ (an arrangement for detecting such a maximum coefficient value is described hereafter). In this circumstance, it is known that the corresponding partial-product P has a magnitude less than $2^{m-1}$. Therefore the bit $p_{m-1}$ is the sign-bit for the partial product, and an m-bit reduced representation $\{0, \ldots, 0, \bar{p}_{m-1}, p_{m-2}, \ldots, p_0\}$ of the partial-product can be generated accordingly. This reduced representation is associated with a compensation vector $C_{B-1,m-1}$, instead of the original compensation vector $C_{B-1,N}$ (again assuming the filter output to be B bits in length). The bits N−1 to m−1 of compensation vector $C_{B-1,m-1}$, denoted as $C_{N-1,m-1}$, can then be used as control signals in the partial-product generation. Such control signals function to flip the value of the sign bit and to generate 0s in the sign extension positions.

Figure 5:
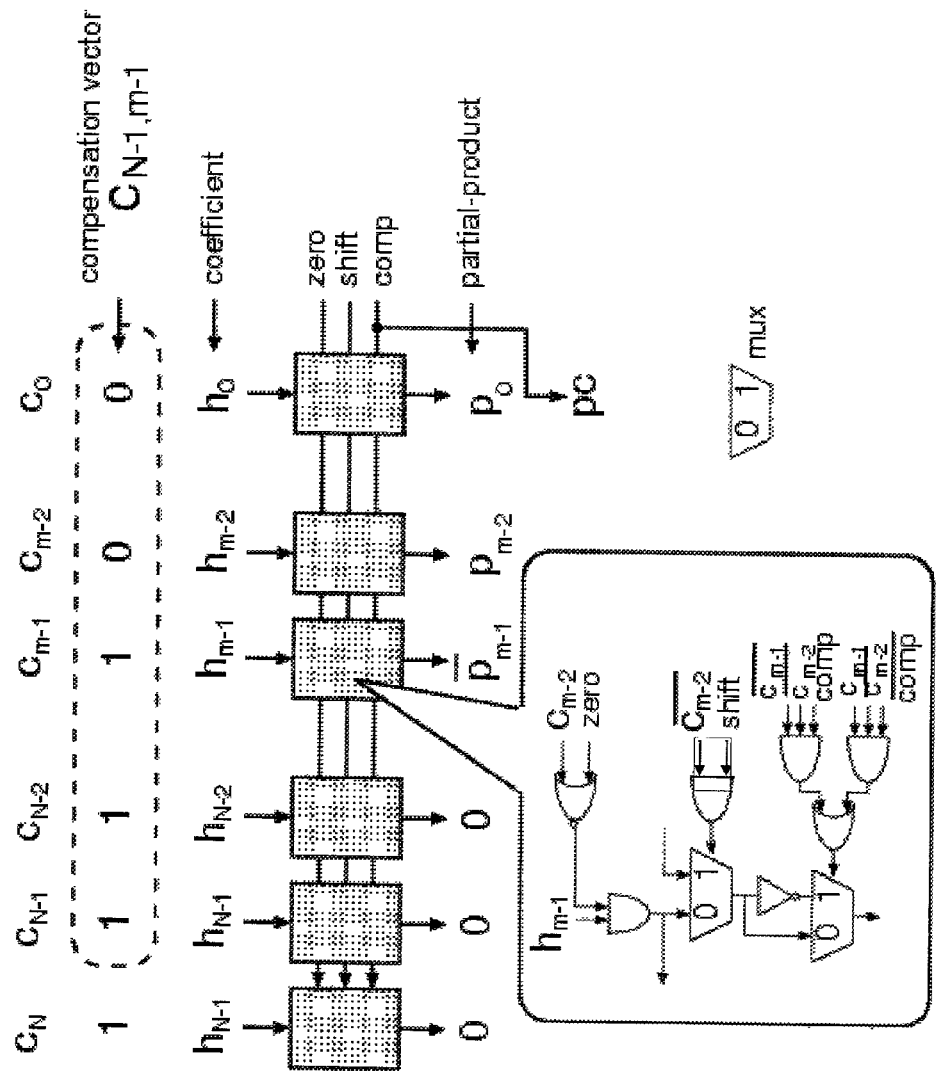
FIG. 5 provides a schematic depiction of a partial-product generator operated according to the method of the invention.
Figure 6:
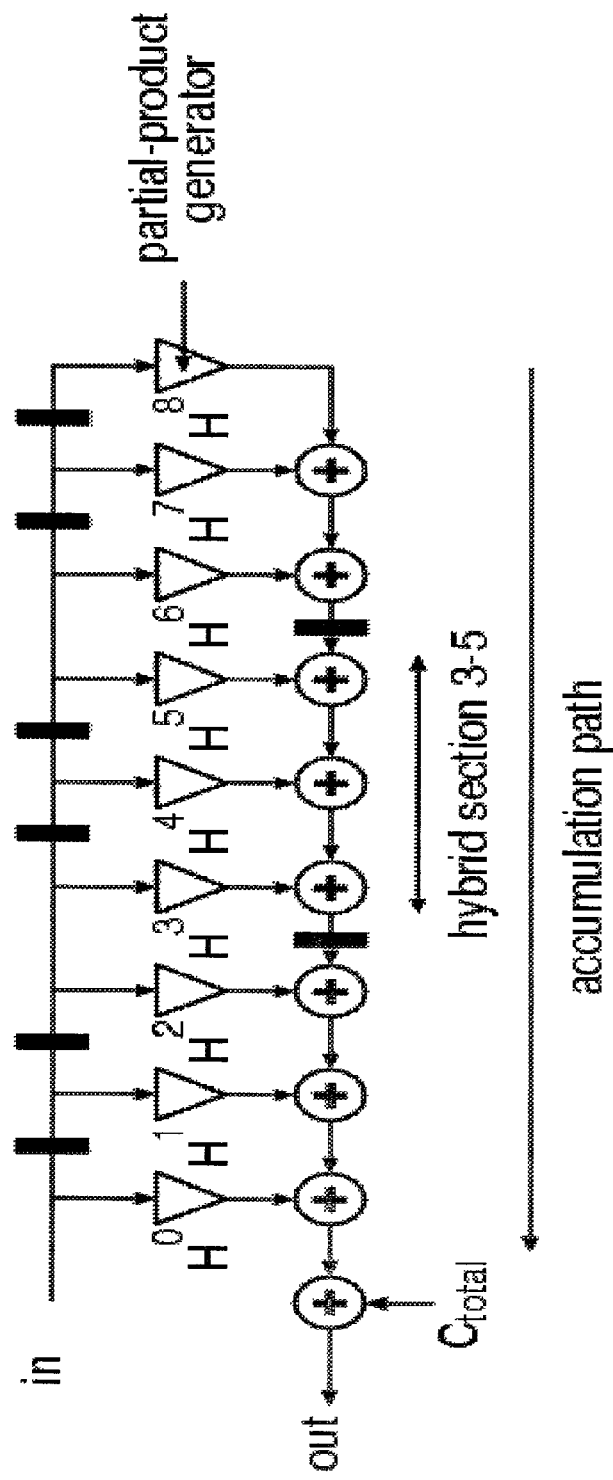
FIG. 6 provides a schematic depiction of a hybrid form FIR filter.

A low power partial-product generator built to output a reduced representation of partial product P is schematically illustrated in FIG. 5. As will be seen from the figure, this reduced representation partial product generator still maintains the parallelism of the standard partial-product generation scheme illustrated in FIG. 2. When both $C_{m-1}$ and $C_{m-2}$ are 0s, partial product values are not modified, as if $C_{m-1}$ and $C_{m-2}$ control signals are non-existent. When both $C_{m-1}$ and $C_{m-2}$ are 1s, the partial product values are 0s, independent of the coefficient bits $h_{m-1}$ and $h_{m-2}$. In the case, and only in that case, of $C_{m-1}=1$ and $C_{m-2}=0$—i.e., when the sign bit is m−1, the partial product value is complemented. This results in the desired reduced representation For the basic embodiment of the invention heretofore described, the magnitude of each coefficient is detected, and a separate compensation vector determined for each coefficient. In a further and somewhat more efficient embodiment of the invention, a hybrid form FIR filter is used. In such a hybrid form, the taps of the filter are divided among a plurality of hybrid sections, where each hybrid section encompasses a given number of taps. The concept of this hybrid form is schematically illustrated in FIG. 6, where each hybrid section encompasses 3 taps. (It is preferred, but not mandatory, that the number of taps in each hybrid section be the same, in order to simplify required compensation circuits as well as for balance of timing and modularity of design.) The adders in the accumulation path could be implemented using carry-save arithmetic. For each hybrid section, a Wallace tree could be used to perform the addition operation.

In this embodiment, the maximum magnitude among the coefficients for all of the taps in a hybrid section is detected. The MSB for the coefficient having that maximum magnitude then becomes the sign bit for the reduced representation of all of the coefficients for that hybrid section. Since the reduced representation for all of the coefficients of a given hybrid section will be of the same length, a single compensation vector can be applied for all of the partial products in that hybrid section. The sum of all of the hybrid-section compensation vectors would then be added at the end of the filter accumulation path.

It will be apparent that the use of reduced representation in partial-product generation introduces a constant error in each tap. Such an error corresponds to the difference between the original compensation vector $C_{B-1,N}$ and the new compensation vector $C_{B-1,m-1}$, which is a string of 1s from bit N−1 to bit m−1: $C_{N-1,m-1}$. As the adaptive filter updates the coefficients, this error is also changing. Also, since there are registers in the accumulation path, it may take several clock cycles for this error to propagate to the output of the filter. In a still further embodiment of the invention, this error is computed and corrected dynamically.

Since this constant error is introduced in the accumulation path of the FIR filter, a compensation vector correction path is needed that imitates the error propagation in the accumulation path. As will be clear from the preceding discussion, the error correction process is simplified for the hybrid-section embodiment of the invention, where the method of the invention detects the maximum magnitude of all filter taps in a given hybrid section, and uses only a single compensation vector for that hybrid section. Thus, all the taps in the same hybrid section introduce the same compensation vector error. The discussion herein of the error correction process of the invention will therefore be based on that hybrid-section embodiment. It should be understood, however, that the principle of that error correction process applies equally to other embodiments of the invention.

Assuming that all coefficients in one hybrid section have a magnitude less than $2^{m-2}$, this hybrid section introduces an error equal to $C_{N-1,\ m-1} \times$ number_of_taps_per_hybrid_section. In the preferred case of each hybrid section containing the same number of taps, the multiplication can be moved to the end of the compensation vector correction path. For the 9-tap hybrid filter shown in FIG. 6, the compensation vector computation path is illustrated in the lower part of FIG. 7, where $C^{i-j}$ is the compensation vector difference introduced by taps i–j in a hybrid section. The multiplication at the end of the compensation vector computation path is a multiplication with a constant (the number of taps per hybrid section) and can easily be implemented with a shift and add.

Figure 7:
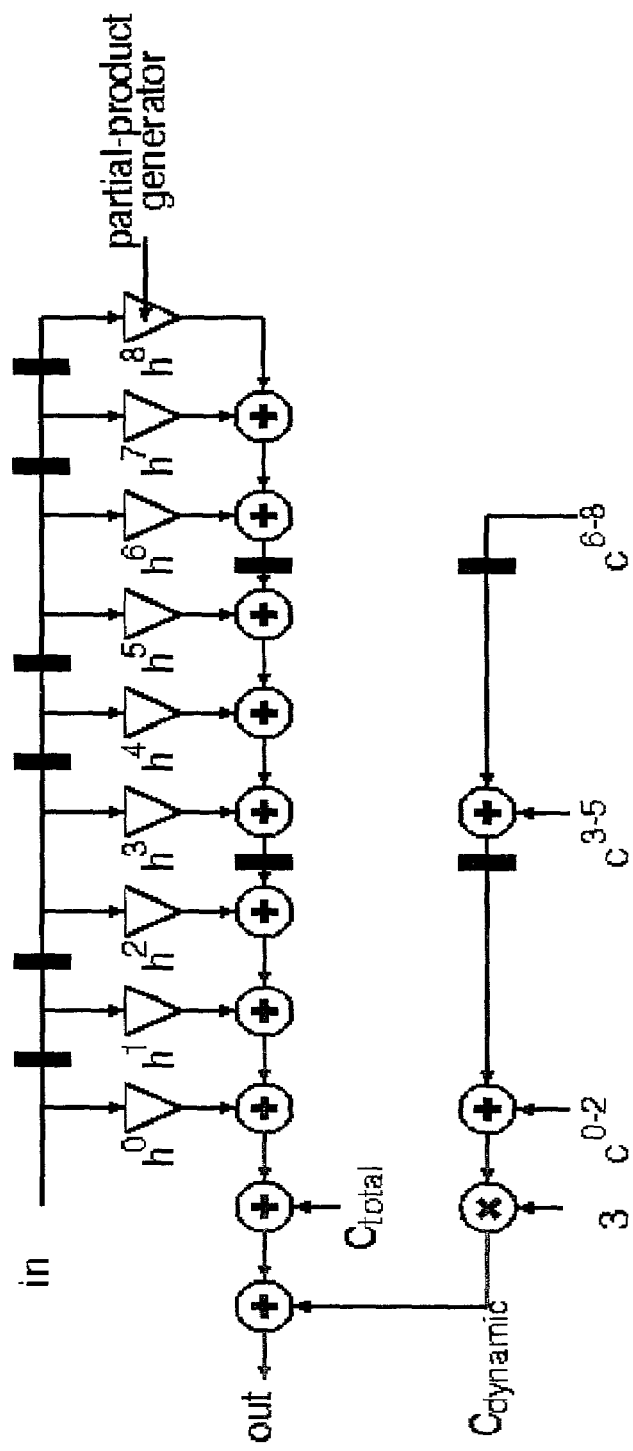
FIG. 7 provides a schematic depiction of an FIR filter operated according to an embodiment of the invention.

Whenever a filter coefficient is updated, the corresponding compensation vector of the hybrid section should be updated. Since the compensation vector computation path has the same number of registers as that in the accumulation path, the change in the compensation vector will correctly propagate to the output and synchronize with the filter output. Thus, for the error correction embodiment of the invention, the filter output should be the sum of three values: (1) the output of the filter accumulation path, (2) the original compensation vector $C_{total}$ and (3) the dynamic compensation vector $C_{dynamic}$. The overall filter diagram is shown in FIG. 7.

Figure 8:
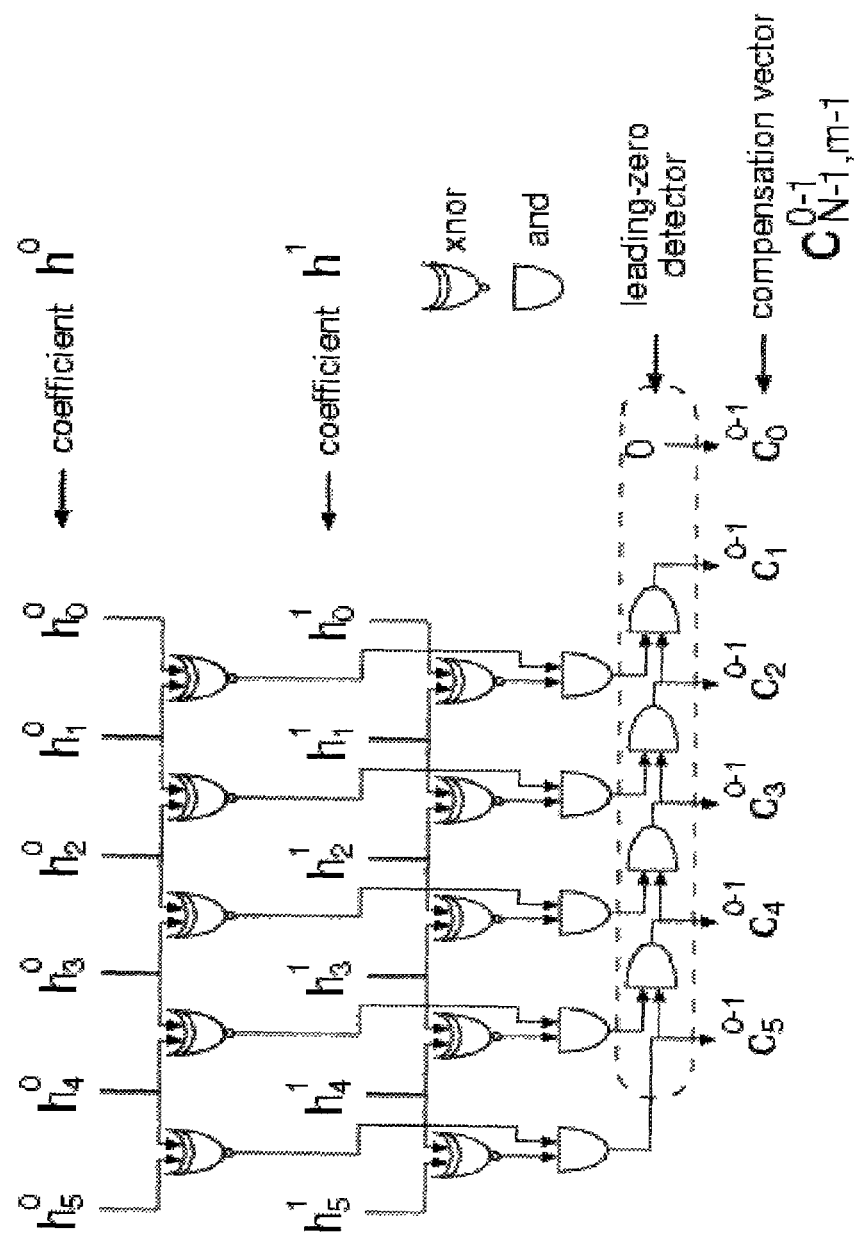
FIG. 8 provides a schematic depiction of an arrangement for detecting filter coefficient magnitude.

An arrangement according to the invention for detecting the maximum coefficient value in a hybrid section is essentially a leading-zero or a leading-one detector. Instead of building a leading-zero/one detector for each coefficient, and comparing them to find the maximum magnitude, a circuit that operates to compute the maximum magnitude of all the coefficients in a single hybrid section in a parallel fashion is shown in FIG. 8 with a 6-bit 2-tap example. One leading-zero detector is built for the section instead of two (one for each tap). In the circuit of FIG. 8, the XNOR-gates for each coefficient detect all the possible locations of the start of the sign-extension for one coefficient, and output 0 if such a location is detected (output 1 if otherwise). The AND-gates detect any such positions of all the coefficients in the hybrid section by outputting 0s. Finally, a leading-zero detector detects the position of the leftmost sign change or the maximum magnitude of all coefficients and generates the compensation vector.

Using dynamic reduced representation according to the invention reduces the signal switching in the MSB bits of the filter accumulation path, and thus results in reduced power dissipation for the filter. As will be apparent, however, from the foregoing discussion, extra circuits are needed to detect the magnitude of the coefficients and to dynamically compute the compensation vectors. Such computation, of course, causes power dissipation. Importantly, this power overhead occurs only when the coefficients are updating. In many adaptive equalization systems, frequent coefficient updating is only needed during the adaptation phase. For a slowly varying channel, slow update is adequate once the coefficients reach convergence. In such a case, the power overhead is negligible. The method of the invention is thus particularly suitable for slowly varying systems. The inventors have empirically determined that the power dissipation in an FIR filter is reduced by approximately 40 percent using the methodology of the invention.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof It is also understood that the words used are words of description, rather that limitation, and that details of the structure may be varied substantially without departing from the spirit of the invention and the exclusive use of all modifications which come within the scope of the appended claims is reserved.

The invention claimed is:

1. A method for operating an arithmetic processor comprising the steps of:
   causing a magnitude of at least one coefficient of the arithmetic processor to be detected and the detected magnitude to be implemented in 2's complement reduced representation arithmetic; and
   adding a compensation vector for the at least one coefficient at an end of an accumulation path for the arithmetic processor.

2. The method of claim 1 wherein all coefficients are implemented in 2's complement reduced representation arithmetic and a separate compensation vector generated for each coefficient, and further wherein a sum of all of the separate compensation vectors is added at the end of the accumulation path.

3. The method of claim 1 comprising the further step of:
   dividing a set of taps of the arithmetic processor among a plurality of sections, wherein the 2's complement reduced representation for ones of the at least one coefficient corresponding to taps within a given section is arranged to have a sign bit at a common bit position.

4. The method of claim 3 wherein the division of the set of taps among a plurality of sections is arranged so that each section has an equal number of taps.

5. The method of claim 3 comprising the further step of detecting a maximum magnitude of coefficients corresponding to taps within a given section, wherein the common bit position for sign bits of coefficients for the given section is established based on the detected maximum coefficient magnitude.

6. The method of claim 5 comprising the further step of providing a common compensation vector for all taps in a given section, a value of the common compensation vector being determined in respect to the common sign bit position, and wherein a total compensation vector value for the given section is determined as a product of the common compensation vector and the number of taps in the given section.

7. The method of claim 3 comprising the further steps of:
computing a difference between the compensation vector determined for a given section based on the common sign bit position and a base compensation vector; and
combining the computed difference with a value of the base compensation vector at the end of the accumulation path.

8. The method of claim 7 wherein the combined computed difference and the value of the base compensation vector comprise the compensation vector added at the end of the accumulation path.

9. The method of claim 8 wherein the step of combining the computed difference further comprises:
computing a product of the determined difference and the number of taps for the given section;
summing products computed for each of the plurality of sections and combining the sum of products with the base compensation vector.

10. The method of claim 7 wherein the step of computing a difference further comprises:
determining a difference in bit position between a sign bit position for the base compensation vector and the common sign bit position for the given section.

11. The method of claim 1 wherein the arithmetic processor is implemented as a filter.

12. The method of claim 1 comprising the further steps of:
computing a difference between the compensation vector determined for the at least one coefficient and a base compensation vector; and
combining the computed difference with a value of the base compensation vector at the end of the accumulation path.

13. An arithmetic processing circuit having a plurality of taps comprising:
a partial product generator operative to generate a partial product in 2's complement reduced representation; and
logic means operating on bit positions of the partial product generator for detecting a sign bit thereof and causing the complementation of the sign bit.

14. The arithmetic processing circuit of claim 13 further comprising:
a detector for detecting a magnitude of ones of the reduced representation partial products; and
generation means for generating a compensation vector corresponding to the detected magnitude of the partial products.

15. The arithmetic processing circuit of claim 14 wherein the plurality of taps is divided among a plurality of equal-length sections and the detector further operates to detect a maximum magnitude of ones of the reduced representation partial products in a given section.

* * * * *